United States Patent [19]

Spielberger

[11] Patent Number: 5,043,533
[45] Date of Patent: Aug. 27, 1991

[54] CHIP PACKAGE CAPACITOR COVER
[75] Inventor: Richard K. Spielberger, Maple Grove, Minn.
[73] Assignee: Honeywell Inc., Minneapolis, Minn.
[21] Appl. No.: 348,999
[22] Filed: May 8, 1989
[51] Int. Cl.$^5$ .............................................. H01L 23/02
[52] U.S. Cl. .................................... 174/52.4; 357/75; 361/306
[58] Field of Search ................... 174/52.4, 52.1, 52.3; 361/331, 380, 393, 397, 400, 403, 301, 306, 308, 309, 310; 357/75

[56] References Cited
U.S. PATENT DOCUMENTS 3,833,753 9/1974 Garboushiam .
4,249,196 2/1981 Durney et al. .
4,451,845 5/1984 Philofsky et al. .
4,598,307 7/1986 Wakabayashi et al. .
4,636,918 1/1987 Jodoin .
4,654,694 3/1987 Val .
4,672,421 6/1987 Lin .
4,714,952 12/1987 Takekawa et al. .

Primary Examiner—Leo P. Picard
Assistant Examiner—Bot L. Ledynh
Attorney, Agent, or Firm—Gregory A. Bruns; John P. Sumner

[57] ABSTRACT

Disclosed is a cover for a semiconductor chip package. The cover comprises a sealing surface for providing a seal between the cover and a semiconductor chip package. A mounting surface for mounting a capacitor to the surface of cover is provided. The mounting surface comprises metalization including a metalized power pad and a metalized ground pad for mounting at least one capacitor on the surface of the cover.

20 Claims, 3 Drawing Sheets

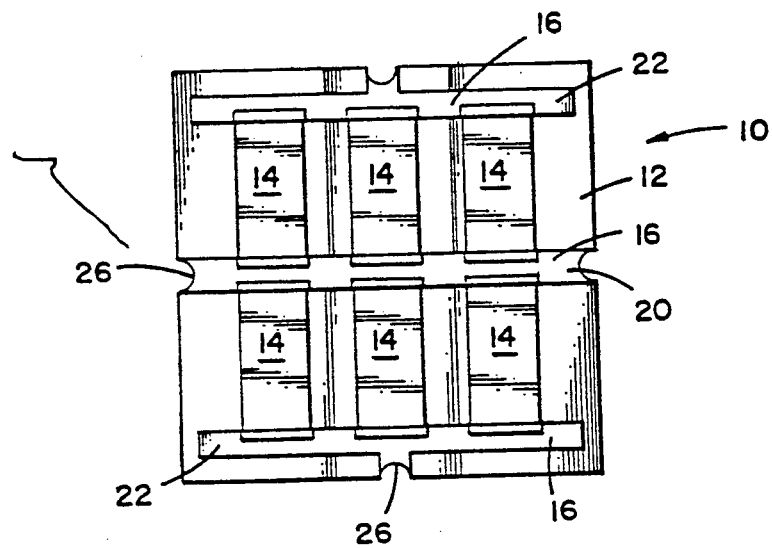
FIG. 1
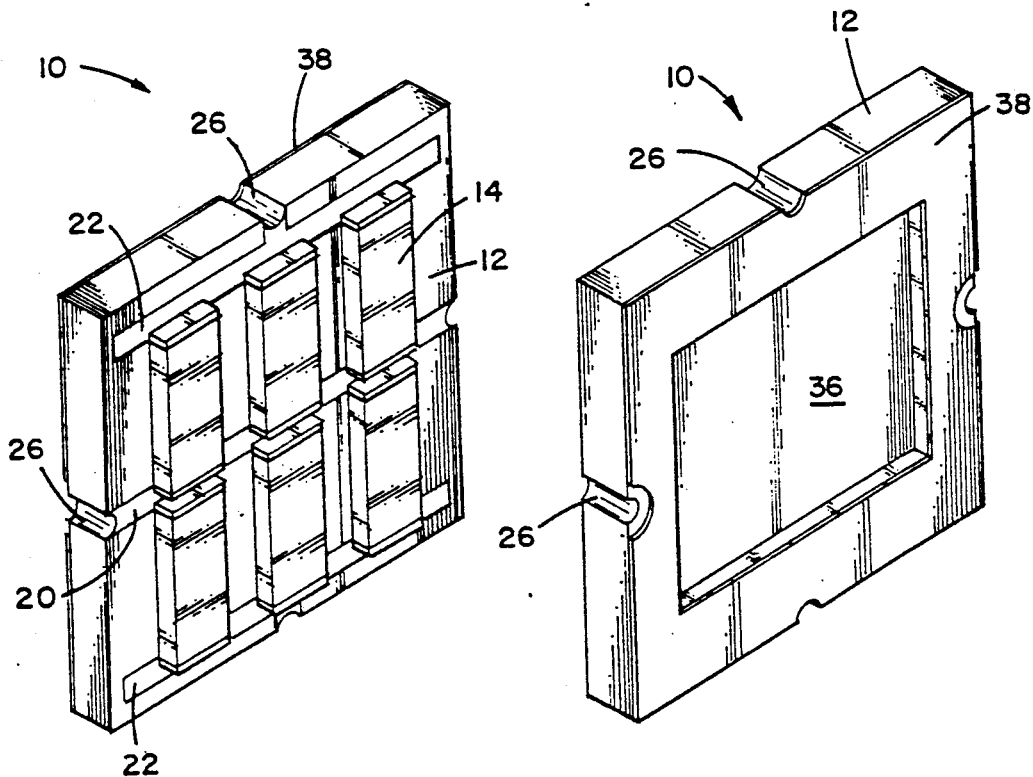
FIG. 2
FIG. 3

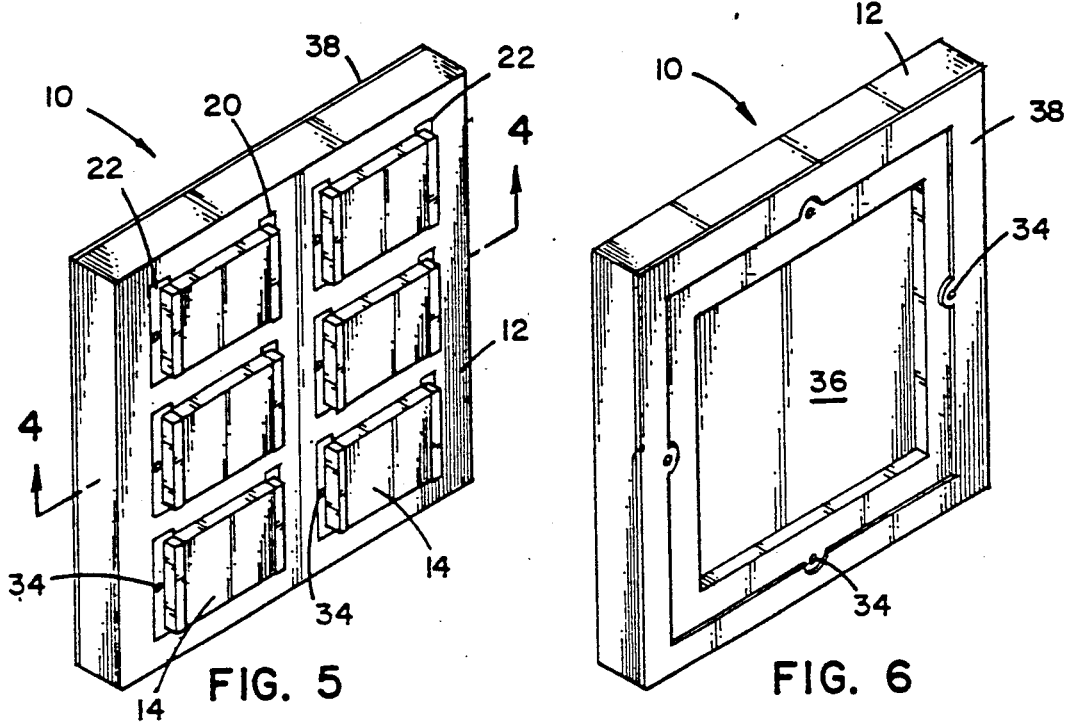
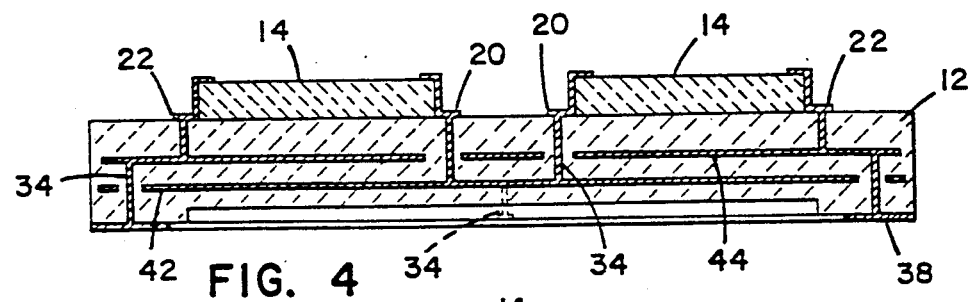
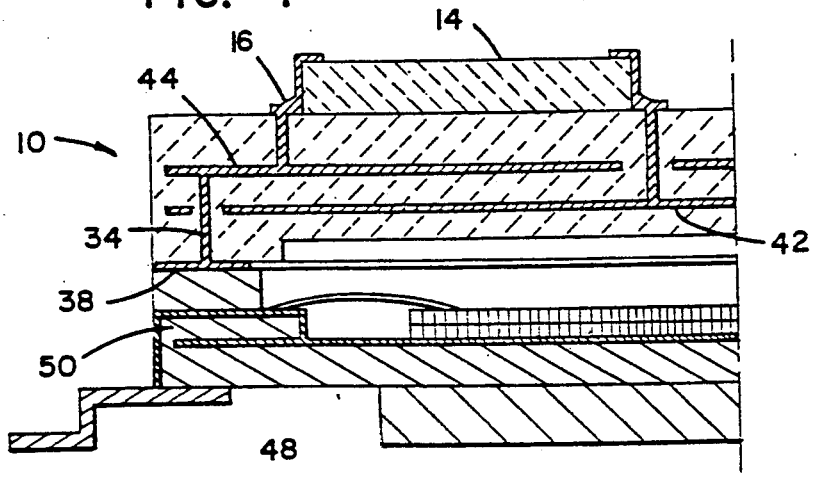

CHIP PACKAGE CAPACITOR COVER

The Government has rights on this invention pursuant to Contract No. DASG 60-85-C-0115, awarded by the Department of Defense and the U.S. Air Force.

FIELD OF THE INVENTION

The present invention relates generally to the field of electronic packaging and more specifically to a cover for a semiconductor package which provides means for mounting a plurality of capacitors external to the cover.

BACKGROUND OF THE INVENTION

In the field of electronic component packaging numerous problems exist. For example, as size and power of electronic components increases, significant problems arise due to undesired inductance. A common solution to this problem includes electrical connection of capacitors near the active device or semiconductor chip. Indeed, the effectiveness of the capacitors depends greatly on the location of each capacitor relative to the chip. The effectiveness of the capacitor improves substantially as it is moved closer to the chip.

Prior art semiconductor chip packages include capacitors for limiting unwanted electronic noise. Many of those devices are limited, however, due to the selection of materials used for constructing the package and/or the capacitors. More specifically, the selection of materials is limited by the varied thermal cycling expansion coefficients of different substances. For example, a capacitor which is mounted inside a chip package may expand or contract at a rate different than that of the package material itself. This expansion differential causes cracking or fractures which degrade the effectiveness of these devices. Yet another problem related to the prior art devices includes placement of capacitors and chips in direct contact. This results in damage to the respective devices when excessive heat build up occurs without means for adequately dissipating that heat. Yet other structures include capacitance means which are inefficient to manufacture and which do not permit varied capacitance on a given package. Moreover, packages which may include a single large capacitor may not be as effective as the present invention due to the greater susceptibility of larger capacitors to undesired cracking.

What has been needed, therefore, has been a cover for a semiconductor chip package comprising mounting surface means for mounting at least one capacitor to a surface of the cover. A preferred cover includes one of various means for electrically connecting the capacitor to the semiconductor chip beneath. Placement of capacitors on the cover surface of a semiconductor chip package permits flexibility, durability, and increased capacitance for that package.

SUMMARY OF THE INVENTION

The present invention is a cover for a semiconductor chip package. The cover comprises sealing surface means located on a surface of the cover to provide a seal between the cover and the semiconductor chip package. Mounting surface means is provided for mounting a capacitor to a surface of the cover. The mounting surface means comprises metalization means including a metalized power pad and a metalized ground pad for mounting the capacitor on the surface of the cover.

BRIEF DESCRIPTION OF THE DRAWINGS

FIG. 1 is a top plan view of a multi-chip capacitor cover.

FIG. 2 is a perspective view of the top portion of a multi-chip capacitor cover illustrating power and ground pads and castellations.

FIG. 3 is a perspective view of the bottom portion of the multi-chip capacitor cover illustrated in FIG. 2.

FIG. 4 is a cross-sectional side elevation view of a multi-chip capacitor cover having metalization means comprising integral power and ground planes.

FIG. 5 is a perspective view of a multi-chip capacitor cover having metalization means comprising vias.

FIG. 6 is a perspective view of the bottom portion of the multi-chip capacitor cover illustrated in FIG. 5.

FIG. 7 is a side elevation cross-sectional view illustrating a multi-chip capacitor cover with capacitors and integral power and ground planes, all mounted on a semiconductor chip package.

DETAILED DESCRIPTION OF THE PREFERRED EMBODIMENTS

Figure 8:
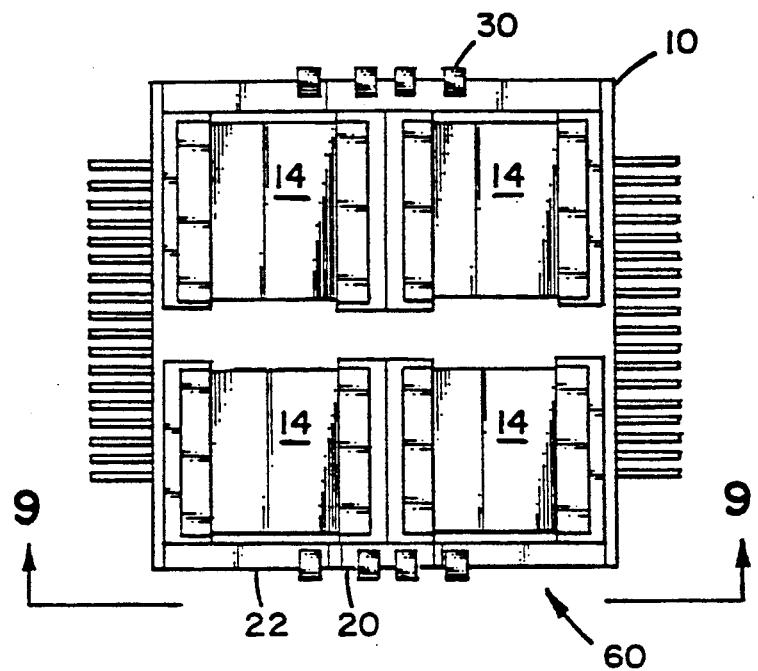
FIG. 8 is a top plan view of a multi-chip capacitor cover having metalization means comprising metal clips.

Detailed embodiments of the present invention are disclosed. It is to be understood, however, that the disclosed embodiments are merely exemplary of the invention, which may be embodied in various forms. Therefore, specific structural and functional details disclosed are not to be interpreted as limiting, but rather as a representative basis for teaching one skilled in the art to variously employ the present invention in virtually any appropriately detailed system or structure. It will be understood that in some circumstances relative material thicknesses and relative component sizes may be shown exaggerated to facilitate an understanding of the invention.

The present invention relates to a cover for a semiconductor chip package which permits mounting of at least one capacitor externally on the cover. The invention includes various means for electrically connecting the power and ground elements of the cover to at least one capacitor, as well as various means for electrical connection of the capacitor(s) to the underlying semiconductor chip.

Referring to FIG. 1, a top plan view of a cover 10 for a semiconductor chip package is shown. Cover 10 preferably comprises mounting surface means 12 for mounting at least one capacitor 14 to a surface of the cover. Mounting surface means 12 preferably comprises metalization means 16 including a metalized power pad 20 and a metalized ground pad 22 for mounting a plurality of capacitors on a surface of the cover.

Metalization means 16 may comprise electrically conductive castellations 26 for connecting both metalized power pad 20 and metalized ground pad 22 to semiconductor chip package power and ground connections. Alternately, metalization means may comprise metal clips 30, illustrated in FIG. 8, or vias 34, illustrated in FIG. 4, for connecting metalized power pad 20 to a semiconductor chip package power connection, and for connecting metalized ground pad 22 to a semiconductor chip package ground connection.

FIG. 2 is a perspective view of preferred cover 10 shown with a plurality of capacitors 14 electrically connected between power pad 20 and ground pads 22. As illustrated, the number of capacitors that are placed on mounting surface means 12 may vary. Moreover, the ability to place numerous small capacitors, which are less susceptible to cracking, on mounting surface means 12, substantially enhances the reliability of cover 10 and capacitors 14 during thermal cycling. Preferred cover 10 includes castellations 26 providing an electrically conductive path to other portions of cover 10 and the semiconductor chip package.

FIG. 3 is a perspective view of the bottom portion of cover 10. Preferred cover 10 bottom portion comprises region 36 comprising an optional cavity constructed and arranged for covering a semiconductor chip. Sealing surface 38 extends peripherally around region 36 and provides means for sealing cover 10 to a semiconductor chip package surface. Sealing surface 38 is typically comprised of tungsten which has been nickel and gold plated, although other conductive materials could be used.

Cover 10 metalization means 16 may also comprise an integral power plane 42 and ground plane 44 as shown in FIG. 4. As illustrated in FIGS. 1 and 4, cover 10 may comprise metalization means comprising castellations 26 for connecting metalized power pad 20 to integral power plane 42 and for connecting integral power plane 42 to a semiconductor chip package power connection. Similarly, metalization means may comprise castellations 26 for connecting metalized ground pad 22 to integral ground plane 44 and for connecting integral ground plane 44 to a semiconductor chip package ground connection.

Alternate metalization means 16 is shown in FIGS. 4 and 5. Alternate metalization means 16 comprises vias 34 for connecting metalized power pads 20 to integral power plane 42 and for connecting integral power plane 42 to a semiconductor chip package power connection. Similarly, metalization means 16 illustrated in FIGS. 4 and 5 includes vias 34 for connecting metalized ground pads 22 to integral ground plane 44 and for connecting integral ground plane 44 to a semiconductor chip package ground connection.

FIG. 6 is a perspective view of a bottom surface of cover 10 configured with vias 34 and chip covering region 36. Sealing surface 38 extends around region 36 and provides means for covering a semiconductor chip.

FIG. 7 illustrates a side elevation view of multichip capacitor cover 10 having multiple capacitors 14 mounted thereon. Capacitors 14 are shown electrically connected to semiconductor chip means 48 by metalization means 16. Metalization means 16 comprises vias 34 for connecting capacitors 14 to integral power plane 42 and integral ground plane 44. Vias 34 also provide means for connecting the power plane 42 and ground plane 44 to respective power and ground connections on semiconductor chip package 50.

Figure 9:
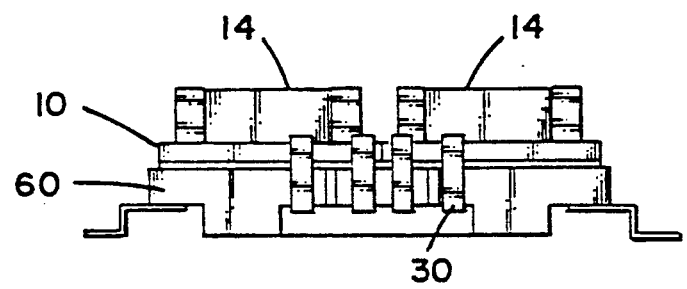
FIG. 9 is a side elevation view illustrating the metal clip connections shown in FIG. 8.

Yet another means for connecting metalized power pads 20 to metalized ground pads 22 is shown in FIGS. 8 and 9 by conductive metal clips 30. FIG. 8 is a top plan view of a representative semiconductor chip package 60 having a chip retaining section therein (not shown) and a multi-chip capacitor cover 10 having multiple capacitors 14 mounted thereon. FIG. 9 is a side elevation view of FIG. 8 which shows a manner of attaching metal clips 30 onto package 60 and cover 10 between ground pads 22 and power pads 20. Use of metal clips 30 permits rapid assembly of components as well as low cost options for varied cover 10 capacitance configurations.

As illustrated in the present invention, multi-chip capacitor cover 10 comprises means for mounting capacitors directly above active devices to provide capacitive means in various combinations. Thus, the various embodiments of cover 10 permit flexible arrangements of capacitors in close proximity to active devices independent of thermal coefficient problems usually caused by different material characteristics of capacitors and chip covers. Accordingly, multi-chip capacitor cover 10 provides for improved noise reduction independent of thermal coefficient mismatch difficulties caused by adjacent components expanding and contracting at different rates.

Figure 10:
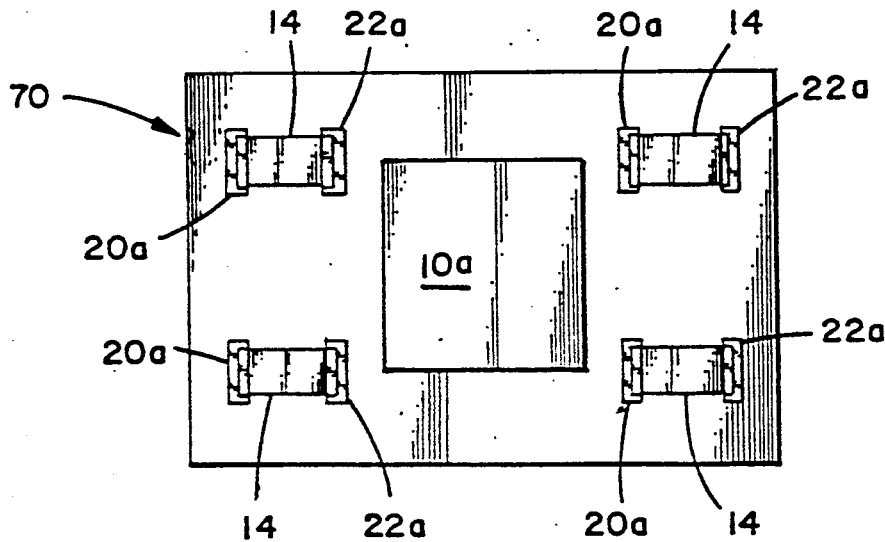
FIG. 10 is a top plan view of a typical prior art semiconductor chip package.

In addition, the present invention provides a significant space saving advantage over typical prior art semiconductor chip package designs such as package 70 illustrated in FIG. 10. In package 70, the package itself comprises metalization regions surrounding typical prior art package covers such as 10a for mounting capacitors 14. For example, such metalized regions typically included metalized power pads 20a and metalized ground pads 22a for mounting capacitors 14 surrounding typical prior art covers 10a. Accordingly, such prior art packages 70 were required to be considerably larger than packages utilizing the present invention, since significant space savings is provided through the present invention by incorporating mounting surface means for mounting a capacitor 14 to the surface of a cover 10, there being no need for configuring packages using the present invention to include space for capacitors 14 surrounding prior art covers such as 10a.

It is to be understood that while certain embodiments of the present invention have been illustrated and described, the invention is not to be limited to the specific forms or arrangements of parts described and shown above, since others skilled in the art may devise other embodiments still within the limits of he claims.

What is claimed is:

1. A cover for a semiconductor chip package, comprising:
  as) a cover plate;
  b) sealing surface means located on a surface of the cover plate for providing a seal between the cover plate and the package; and
  c) mounting surface means located on a capacitor mounted surface of the cover plate for mounting a capacitor to the capacitor mounting surface of the cove plate, the mounting surface means comprising metalization means including a metalized power pad and a metalized ground pad for mounting a capacitor on the capacitor mounting surface of the cover plate.

2. The cover of claim 1 wherein the metalization means comprises a power plane and a ground plane, both planes being integral to the cover plate.

3. The cover of claim 2 wherein the metalization means comprises:
  a) vias for connecting the metalized power pad to the integral power plane and for connecting the integral power plane to a semiconductor chip package power connection; and
  b) vias for connecting the metalized ground pad to the integral ground plane and for connecting the integral ground plane to a semiconductor chip package ground connection.

4. The cover of claim 2 wherein the metalization means comprises:
   a) castellations for connecting the metalized power pad to the integral power plane and for connecting the integral power plane to a semiconductor chip package power connection; and
   b) castellations for connecting the metalized ground pad to the integral ground plane and for connecting the integral ground plane to a semiconductor chip package ground connection.

5. The cover of claim 2 wherein the metalization means comprises:
   a) metal clips for connecting the metalized power pad to the integral power plane and for connecting the integral power plane to a semiconductor chip package power connection; and
   b) metal clips for connecting the metalized ground pad to the integral ground plane and for connecting the integral ground plane to a semiconductor chip package ground connection.

6. A cover for a semiconductor chip package comprising:
   a) a cover plate;
   b) sealing surface means located on a surface of the cover plate for providing a seal between the cover plate and the package;
   c) mounting surface means located on a capacitor mounting surface of the cover plate for mounting a plurality of capacitors on the capacitor mounting surface of the cover plate, the mounting surface means including metalization means comprising metalized power pad regions and metalized ground pad regions;
   d) the metalized power pad regions being electrically isolated form the metalized ground pad regions and being configured for connection to semiconductor chip package power connections; and
   e) the metalized ground pad regions being electrically isolated from the metalized power pad regions and being configured for connection to semiconductor chip package ground connections.

7. The cover of claim 6 wherein the metalization means comprises a power plane and a ground plane, both paleness being integral to the cover plate.

8. The cover of claim 7 wherein the metalization means comprises:
   a) vias for connecting the metalized power pad regions to the integral power plane and for connecting the integral power plane to a semiconductor chip package power connection; and
   b) vias for connecting the metalized ground pad regions to the integral ground plane and for connecting the integral ground plane to a semiconductor chip package ground connection.

9. The cover of claim 7 wherein the metalization means comprises:
   a) castellations for connecting the metalized power pads to the integral power plane and for connecting the integral power plane to a semiconductor chip package power connection; and
   b) castellations for connecting the metalized ground pads to the integral ground plane and for connecting the integral ground plane to semiconductor chip package ground connection.

10. The cover of claim 7 wherein the metalization means comprises:
    a) metal clips for connecting the metalized power pads to the integral power plane and for connecting the integral power plane to a semiconductor chip package power connection; and
    b) metal clips for connecting the metalized ground pads to the integral ground plane and for connecting the integral ground plane to a semiconductor chip package ground connection.

11. A semiconductor chip package, comprising:
    a) package means for holding a semiconductor chip;
    b) a cover plate for providing a package seal, the cover plate comprising sealing surface means for providing a seal between the cover plate and the package means; and
    c) mounting surface means located on a capacitor mounting surface of the cover plate for mounting a capacitor to the capacitor mounting surface of the cover plate, the mounting surface means including metalization means comprising a metalized power pad and a metalized ground pad for electrically connecting the capacitor to the capacitor mounting surface of the cover plate.

12. The semiconductor chip package of claim 11 wherein the metalization means comprises a power plane and a ground plane, both planes being integral to the cover plate.

13. The semiconductor chip package of claim 12 wherein the metalization means comprises:
    a) vias for connecting the metalized power pad to the integral power plane and for connecting the integral power plane to a power connection of the semiconductor chip package; and
    b) vias for connecting the metalized ground pad to the integral ground plane and for connecting the integral ground plane to a ground connection of the semiconductor chip package.

14. The semiconductor chip package of claim 12 wherein the metalization means comprises:
    a) castellations for connecting the metalized power pad to the integral power plane and for connecting the integral power plane to a power connection of the semiconductor chip package; and
    b) castellations for connecting the metalized ground pad to the integral ground plane and for connecting the integral ground plane to a ground connection of the semiconductor chip package.

15. The semiconductor chip package of claim 12 wherein the metalization means comprises:
    a) metal clips for connecting the metalized power pad to the integral power plane and for connecting the integral power plane to a power connection of the semiconductor chip package; and
    b) metal clips for connecting the metalized ground pad to the integral ground plane and for connecting the integral ground plane to a ground connection of the semiconductor chip package.

16. A semiconductor chip package, comprising:
    a) package means for holding a semiconductor chip;
    b) a cover plate for providing a package seal, the cover plate comprising sealing surface means for providing a seal between the cove plate and the package means;
    c) mounting surface means located on a capacitor mounting surface of the cover plate for mounting a plurality of capacitors on the capacitor mounting surface of the cover plate, the mounting surface means including metalization mean comprising metalized power pad regions and metalized ground pad regions;

d) the metalized power pad regions being electrically isolated for the metalized ground pad regions and being configured for connection to semiconductor chip package power connections; and e) the metalized ground pad regions being electrically isolated from eh metalized power pad regions and being configured for connection semiconductor chip package ground connections.

17. The package of claim 16 wherein the metalization means comprises a power plane and a ground plane, both planes being integral to the cover plate.

18. The semiconductor chip package of claim 17 wherein the metalization means comprises:

a) vias for connecting the metalized power pad regions to the integral power plane and for connecting the integral power plane to semiconductor chip package power connections; and b) vias for connecting the metalized ground pad regions to the integral ground plane and for connecting the integral ground plane to semiconductor chip package ground connections.

19. The semiconductor chip package of claim 17 wherein the metalization means comprises:

a) castellations for connecting the metalized power pads to the integral power plane and for connecting the integral power plane to semiconductor chip package power connections; and b) castellations for connecting the metalized ground pads to the integral ground plane and for connecting the integral ground plane to semiconductor chip package ground connections.

20. The semiconductor chip package of claim 17 wherein the metalization means comprises:

a) metal clips for connecting the metalized power pads to the integral power plane and for connecting the integral power plane to a semiconductor chip package power connection; and b) metal clips for connecting the metalized ground pads to the integral ground plane and for connecting the integral ground plane to semiconductor chip package ground connections.

* * * * *

UNITED STATES PATENT AND TRADEMARK OFFICE
CERTIFICATE OF CORRECTION

PATENT NO. : 5,043,533
DATED      : August 27, 1991
INVENTOR(S): Richard K. Spielberger It is certified that error appears in the above-identified patent and that said Letters Patent is hereby corrected as shown below:

Column 4, line 46, substitute "a)" for --as)--

Column 5, line 46, substitute "planes" for --paleness--

Column 5, line 65, after "to" insert --a--

Column 6, line 62, substitute "cover" for --cove--

Column 7, line 9, substitute "the" for --eh--

Signed and Sealed this

Twenty-ninth Day of December, 1992

Attest:

DOUGLAS B. COMER

*Attesting Officer*         Acting Commissioner of Patents and Trademarks